(12) United States Patent
Hu et al.

(10) Patent No.: US 11,223,010 B2
(45) Date of Patent: Jan. 11, 2022

(54) THIN REFERENCE LAYER FOR STT MRAM

(71) Applicants: International Business Machines Corporation, Armonk, NY (US); Samsung Electronics Co., Ltd., Suwon-si (KR)

(72) Inventors: Guohan Hu, Yorktown Heights, NY (US); Younghyun Kim, Seoul (KR); Daniel C. Worledge, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 262 days.

(21) Appl. No.: 16/409,905

(22) Filed: May 13, 2019

(65) Prior Publication Data

US 2019/0288186 A1     Sep. 19, 2019

Related U.S. Application Data

(62) Division of application No. 15/094,064, filed on Apr. 8, 2016, now Pat. No. 10,361,361.

(51) Int. Cl.
*H01L 43/08* (2006.01)
*H01L 43/10* (2006.01)

(52) U.S. Cl.
CPC .............. *H01L 43/08* (2013.01); *H01L 43/10* (2013.01)

(58) Field of Classification Search
CPC .................................. H01L 43/08; H01L 43/10
See application file for complete search history.

(56) References Cited

U.S. PATENT DOCUMENTS

| | | | | |
|---|---|---|---|---|
| 4,486,498 A | | 12/1984 | Saito | |
| 5,768,181 A | * | 6/1998 | Zhu | G11C 11/15 365/158 |
| 5,801,984 A | * | 9/1998 | Parkin | H01L 43/08 365/158 |
| 6,122,150 A | * | 9/2000 | Gill | B82Y 25/00 360/324.11 |
| 6,291,087 B1 | * | 9/2001 | Xiao | B82Y 25/00 428/811.2 |

(Continued)

OTHER PUBLICATIONS

Liu et al., "Thermally robust Mo/CoFeB/MgC trilayers with strong perpendicular magnetic anisotrophy", Scientific Reports; 4:5895; Jul. 31, 2014. (Year: 2014).*

(Continued)

*Primary Examiner* — Allen L Parker
*Assistant Examiner* — Charles N Ausar-El
(74) *Attorney, Agent, or Firm* — Cantor Colburn LLP; Daniel Morris

(57) ABSTRACT

Techniques relate to forming a magnetic tunnel junction (MTJ). A synthetic antiferromagnetic reference layer is adjacent to a tunnel barrier layer. The synthetic antiferromagnetic reference layer includes a first magnetic layer, a second magnetic layer, and a reference spacer layer sandwiched between the first magnetic layer and the second magnetic layer. A magnetic free layer is adjacent to the tunnel barrier layer so as to be opposite the synthetic antiferromagnetic reference layer. The synthetic antiferromagnetic reference layer has a thickness of at least one of 3 nanometers (nm), 4 nm, and 3-4 nm.

20 Claims, 5 Drawing Sheets

(56) References Cited

U.S. PATENT DOCUMENTS

| | | | |
|---|---|---|---|
| 6,365,286 B1 | 4/2002 | Inomata et al. | |
| 6,469,926 B1* | 10/2002 | Chen | B82Y 40/00 365/158 |
| 6,544,801 B1* | 4/2003 | Slaughter | H01L 43/12 438/3 |
| 6,641,935 B1* | 11/2003 | Li | G11B 5/66 428/336 |
| 6,714,444 B2* | 3/2004 | Huai | B82Y 25/00 365/158 |
| 6,731,477 B2* | 5/2004 | Lin | G11B 5/3903 360/324.1 |
| 6,743,503 B1* | 6/2004 | Chen | C23C 14/165 428/336 |
| 6,778,427 B2* | 8/2004 | Odagawa | B82Y 10/00 257/E21.665 |
| 6,831,312 B2* | 12/2004 | Slaughter | H01L 43/10 257/295 |
| 6,911,256 B2* | 6/2005 | Sexton | B32B 15/01 428/336 |
| 6,953,629 B2* | 10/2005 | Hintz | B32B 15/018 428/827 |
| 7,018,725 B2* | 3/2006 | Odagawa | H01F 10/3204 428/692.1 |
| 7,098,495 B2* | 8/2006 | Sun | H01F 41/303 257/295 |
| 7,349,187 B2* | 3/2008 | Parkin | B82Y 10/00 257/E43.004 |
| 7,390,529 B2* | 6/2008 | Li | G11B 5/3929 427/127 |
| 7,430,135 B2* | 9/2008 | Huai | H01L 43/08 257/E43.004 |
| 7,528,457 B2* | 5/2009 | Horng | H01L 43/12 257/421 |
| 7,605,437 B2* | 10/2009 | Mancoff | G11C 11/16 257/295 |
| 7,609,490 B2* | 10/2009 | Mizuno | G01R 33/093 360/324.11 |
| 7,630,232 B2* | 12/2009 | Guo | B82Y 25/00 365/158 |
| 7,672,093 B2* | 3/2010 | Horng | G11B 5/3906 360/324.2 |
| 7,663,197 B2 | 12/2010 | Nagase et al. | |
| 7,932,571 B2* | 4/2011 | Rizzo | G11C 11/161 257/421 |
| 8,064,244 B2 | 11/2011 | Zhang et al. | |
| 8,508,006 B2 | 8/2013 | Jan et al. | |
| 8,513,748 B2* | 8/2013 | Fukumoto | B82Y 25/00 257/421 |
| 8,565,013 B2* | 10/2013 | Bessho | H01L 43/08 365/158 |
| 8,760,154 B2 | 6/2014 | Giddings et al. | |
| 8,779,537 B2* | 7/2014 | Huai | H01F 10/3272 257/421 |
| 8,797,692 B1* | 8/2014 | Guo | G11B 5/3909 360/319 |
| 8,829,631 B2* | 9/2014 | Yamane | G11C 11/16 257/421 |
| 8,871,365 B2* | 10/2014 | Wang | G11B 5/66 428/811 |
| 8,917,543 B2 | 12/2014 | Ranjan et al. | |
| 9,082,958 B2* | 7/2015 | Lu | H01L 43/02 |
| 9,087,977 B2 | 7/2015 | Park et al. | |
| 9,099,124 B1* | 8/2015 | Freitag | G01R 33/093 |
| 9,136,464 B1* | 9/2015 | Whig | H01L 43/08 |
| 9,214,624 B2* | 12/2015 | Lee | G11C 11/161 |
| 9,276,233 B2* | 3/2016 | Zhang | H01L 51/5246 |
| 9,379,314 B2 | 6/2016 | Park et al. | |
| 9,385,304 B2* | 7/2016 | Nakayama | G11C 11/16 |
| 9,455,400 B2* | 9/2016 | Cao | H01L 43/02 |
| 9,537,088 B1* | 1/2017 | Harms | H01L 43/08 |
| 9,647,204 B2 | 5/2017 | Hu et al. | |
| 9,793,319 B2* | 10/2017 | Gan | H01L 43/02 |
| 9,799,823 B1 | 10/2017 | Hu et al. | |
| 9,865,805 B2 | 1/2018 | Seino et al. | |
| 10,026,888 B2 | 7/2018 | Ochiai et al. | |
| 10,361,361 B2* | 7/2019 | Hu | H01L 43/08 |
| 2003/0096127 A1 | 5/2003 | Hikosaka et al. | |
| 2004/0075960 A1* | 4/2004 | Li | G11B 5/3932 360/324.12 |
| 2004/0091744 A1* | 5/2004 | Carey | G01R 33/093 428/811.1 |
| 2004/0130431 A1 | 7/2004 | Matsukawa et al. | |
| 2004/0145850 A1* | 7/2004 | Fukumoto | H01F 10/06 361/143 |
| 2004/0257719 A1* | 12/2004 | Ohba | G01R 33/093 360/324.2 |
| 2005/0219769 A1* | 10/2005 | Shimura | G11B 5/3909 360/324.2 |
| 2006/0002184 A1* | 1/2006 | Hong | G11B 5/3906 365/171 |
| 2006/0018057 A1* | 1/2006 | Huai | G11C 11/16 360/324.2 |
| 2006/0098354 A1* | 5/2006 | Parkin | G11B 5/3903 360/324.2 |
| 2006/0114618 A1* | 6/2006 | Hosomi | G11C 11/16 360/324.1 |
| 2006/0141640 A1* | 6/2006 | Huai | G11C 11/16 438/3 |
| 2006/0180839 A1* | 8/2006 | Fukumoto | H01F 10/30 257/295 |
| 2006/0221680 A1* | 10/2006 | Hosotani | G11C 11/15 365/171 |
| 2006/0262594 A1* | 11/2006 | Fukumoto | B82Y 25/00 365/158 |
| 2007/0076469 A1* | 4/2007 | Ashida | H01L 43/08 365/158 |
| 2007/0111332 A1* | 5/2007 | Zhao | G01R 33/098 438/3 |
| 2007/0183187 A1* | 8/2007 | Guo | B82Y 25/00 365/158 |
| 2007/0228501 A1* | 10/2007 | Nakamura | H01L 27/228 257/421 |
| 2007/0278547 A1* | 12/2007 | Pietambaram | H01L 43/08 257/296 |
| 2008/0023740 A1* | 1/2008 | Horng | B82Y 25/00 257/295 |
| 2008/0074805 A1* | 3/2008 | Ikarashi | H01L 43/08 360/324.2 |
| 2008/0179699 A1* | 7/2008 | Horng | H01L 43/12 257/421 |
| 2008/0182342 A1* | 7/2008 | Parkin | B82Y 10/00 438/3 |
| 2008/0239589 A1 | 10/2008 | Guo et al. | |
| 2008/0258247 A1* | 10/2008 | Mancoff | G11C 11/16 257/421 |
| 2008/0299679 A1* | 12/2008 | Zhao | G11B 5/3909 438/3 |
| 2009/0027810 A1* | 1/2009 | Horng | H01L 43/08 360/324.2 |
| 2009/0108383 A1* | 4/2009 | Horng | H01L 43/08 257/421 |
| 2010/0148167 A1* | 6/2010 | Whig | G11C 11/16 257/43 |
| 2010/0176470 A1* | 7/2010 | Horng | H01L 43/08 257/421 |
| 2010/0195380 A1* | 8/2010 | Wang | G11C 11/1675 365/171 |
| 2010/0302690 A1* | 12/2010 | Worledge | G11C 11/161 360/324.11 |
| 2010/0320550 A1* | 12/2010 | Abraham | G11C 11/1675 257/421 |
| 2011/0303995 A1* | 12/2011 | Worledge | G11C 11/161 257/421 |
| 2011/0303996 A1* | 12/2011 | Kim | H01F 10/3236 257/421 |
| 2012/0028373 A1* | 2/2012 | Belen | H01L 43/12 438/3 |
| 2012/0043631 A1 | 2/2012 | Ohmori et al. | |

(56) References Cited

U.S. PATENT DOCUMENTS

| | | | | |
|---|---|---|---|---|
| 2012/0267733 A1* | 10/2012 | Hu | .......................... | H01L 43/10 257/421 |
| 2012/0286382 A1* | 11/2012 | Jan | ...................... | G11C 11/161 257/421 |
| 2012/0295132 A1* | 11/2012 | Min | ..................... | G11B 5/1278 428/812 |
| 2012/0299134 A1* | 11/2012 | Jan | ...................... | G11C 11/161 257/421 |
| 2012/0313191 A1* | 12/2012 | Whig | ................... | G11C 11/161 257/421 |
| 2013/0175644 A1* | 7/2013 | Horng | .................. | G11C 11/161 257/421 |
| 2013/0230741 A1 | 9/2013 | Wang et al. | | |
| 2013/0270523 A1* | 10/2013 | Wang | ................ | H01F 10/3286 257/30 |
| 2014/0027869 A1 | 1/2014 | Lee et al. | | |
| 2014/0070341 A1* | 3/2014 | Beach | .................... | H01L 43/08 257/421 |
| 2014/0103469 A1* | 4/2014 | Jan | .......................... | H01F 10/30 257/421 |
| 2014/0145792 A1 | 5/2014 | Wang et al. | | |
| 2014/0252518 A1* | 9/2014 | Zhang | .................. | G01R 33/093 257/422 |
| 2014/0306302 A1* | 10/2014 | Jan | ..................... | H01F 10/3272 257/421 |
| 2014/0319634 A1* | 10/2014 | Shukh | ................... | G11C 11/161 257/427 |
| 2015/0001656 A1 | 1/2015 | Beach et al. | | |
| 2015/0008550 A1* | 1/2015 | Min | ..................... | G11C 11/161 257/421 |
| 2015/0129946 A1* | 5/2015 | Annunziata | ........... | G11C 11/161 257/295 |
| 2015/0171316 A1* | 6/2015 | Park | ........................ | H01L 43/12 257/421 |
| 2015/0263266 A1 | 9/2015 | Gottwald et al. | | |
| 2016/0027999 A1 | 1/2016 | Pinarbasi | | |
| 2016/0099404 A1* | 4/2016 | Hu | .......................... | H01L 43/10 257/421 |
| 2016/0181508 A1* | 6/2016 | Lee | ......................... | H01L 43/08 257/421 |
| 2016/0190436 A1* | 6/2016 | Hu | ......................... | G11C 11/161 438/3 |
| 2016/0284986 A1* | 9/2016 | Hu | .......................... | H01F 10/14 |
| 2016/0315249 A1 | 10/2016 | Kardasz et al. | | |
| 2016/0372656 A1 | 12/2016 | Pinarbasi et al. | | |
| 2016/0380188 A1 | 12/2016 | Hu et al. | | |
| 2017/0117459 A1 | 4/2017 | Watanabe et al. | | |
| 2017/0125078 A1 | 5/2017 | Mihajlovic et al. | | |
| 2017/0125480 A1 | 5/2017 | Annunziata et al. | | |
| 2017/0125481 A1 | 5/2017 | Kan et al. | | |
| 2017/0125664 A1* | 5/2017 | Tahmasebi | .............. | H01L 43/02 |
| 2017/0148978 A1 | 5/2017 | Apalkov et al. | | |
| 2017/0170388 A1* | 6/2017 | Whig | ...................... | H01L 43/08 |
| 2017/0170390 A1* | 6/2017 | Swerts | .................... | H01L 43/08 |
| 2017/0186942 A1 | 6/2017 | Lee et al. | | |
| 2017/0294482 A1* | 10/2017 | Hu | ......................... | H01L 27/226 |
| 2017/0294573 A1 | 10/2017 | Hu et al. | | |
| 2017/0331033 A1 | 11/2017 | Kardasz et al. | | |
| 2018/0076382 A1 | 3/2018 | Park et al. | | |
| 2019/0123098 A1* | 4/2019 | Sun | ...................... | G11B 5/3909 |
| 2019/0198566 A1* | 6/2019 | Wang | ..................... | H01L 43/08 |

OTHER PUBLICATIONS

Colis, S., et al.; "Magnetic, Transport, and Structural Properties of Fe/Co/Cu/[Co/Ir/Co] Sandwiches and Fe/Co/Cu/[Co/Ir] Multilayers Prepared by Ion-Beam Sputtering"; The American Physical Society; Physical Review B; vol. 62, No. 17 p. 709-718; 2000.

List of IBM Patents or Patent Applications Treated as Related; Date Filed: May 13, 2019, 2 pages.

Worledge, D.C., et al.; "Spin Torque Switching of Perpendicular Ta/CoFeB/MgO-based Magnetic Tunnel Junctions" Applied Physics Letters; vol. 98; p. 022501-1-022501-3; 2011.

* cited by examiner

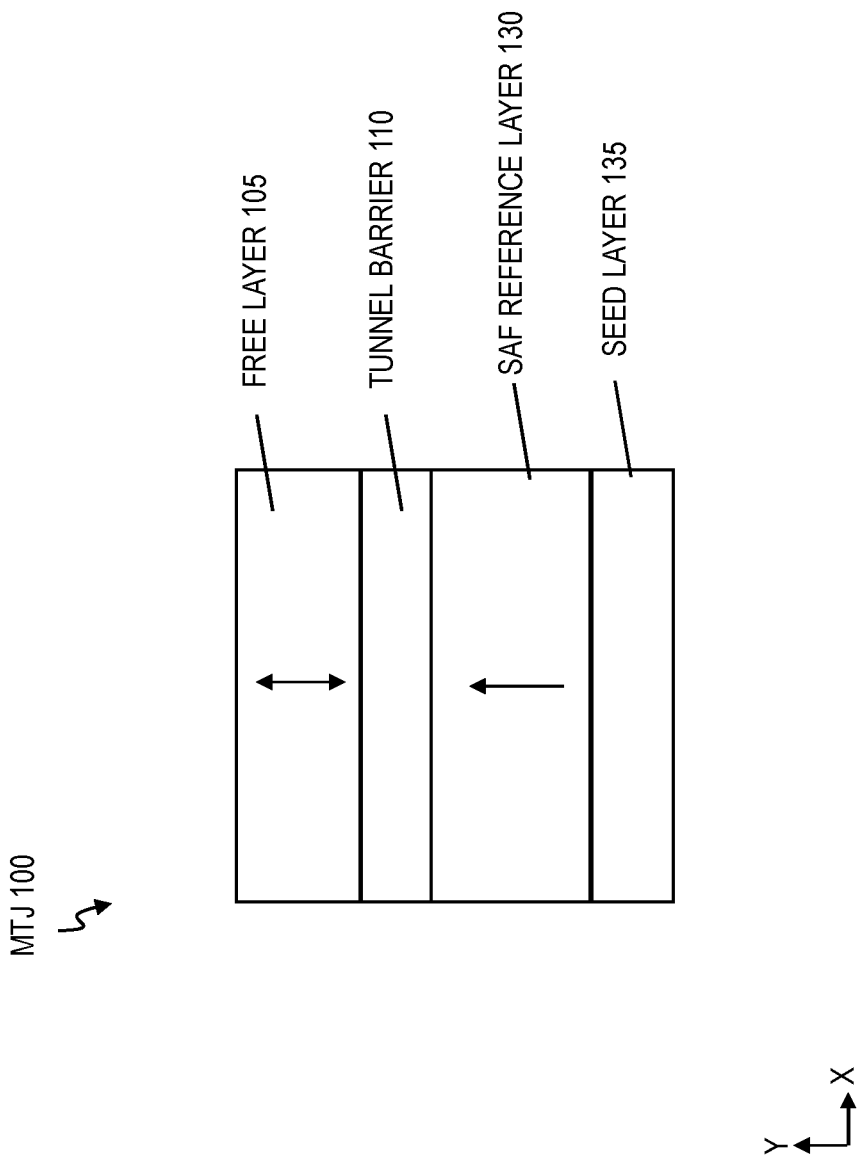

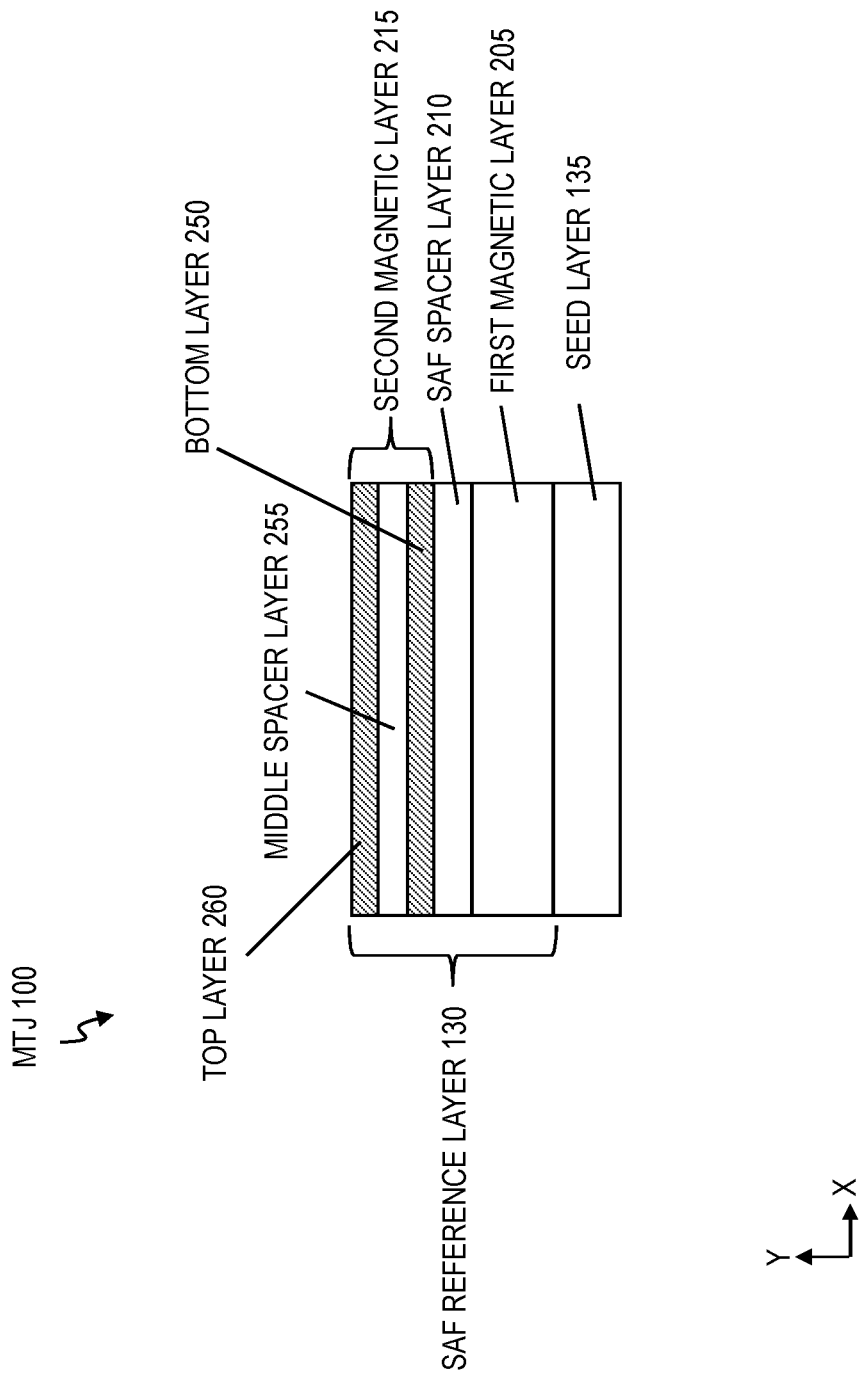

FORM A SYNTHETIC ANTIFERROMAGNETIC REFERENCE LAYER ADJACENT TO A TUNNEL BARRIER LAYER, THE SYNTHETIC ANTIFERROMAGNETIC REFERENCE LAYER INCLUDING A FIRST MAGNETIC LAYER, A SECOND MAGNETIC LAYER, AND A REFERENCE SPACER LAYER SANDWICHED BETWEEN THE FIRST MAGNETIC LAYER AND THE SECOND MAGNETIC LAYER 505

→

FORM A MAGNETIC FREE LAYER ADJACENT TO THE TUNNEL BARRIER LAYER SO AS TO BE OPPOSITE THE SYNTHETIC ANTIFERROMAGNETIC REFERENCE LAYER 510

→

THE SYNTHETIC ANTIFERROMAGNETIC REFERENCE LAYER HAS A THICKNESS OF AT LEAST ONE OF 3 NANOMETERS (NM), 4 NM, AND/OR 3-4 NM 515

THIN REFERENCE LAYER FOR STT MRAM

BACKGROUND

The present invention relates generally to semiconductors, and more specifically, to an ultra-thin reference layer for spin torque transfer (STT) magnetic random access memory (MRAM).

Magnetic random access memory (MRAM) is a non-volatile computer memory (NVRAM) technology. Unlike conventional RAM chip technologies, in MRAM data is not stored as electric charge or current flows, but by magnetic storage elements. The elements are formed using two ferromagnetic plates, separated by a thin insulating layer. One of the two plates is a permanent magnet set to a particular polarity; the other's magnetic field can be changed. This configuration is known as a spin valve and is the simplest structure for a MRAM bit. A memory device is built from a grid of such "cells".

A typical method of reading is accomplished by measuring the electrical resistance of the cell. A particular cell is (typically) selected by turning on an associated access transistor which passes current from a supply line through the cell to ground. Due to the magnetic tunnel effect, the electrical resistance of the cell changes with the relative orientation of the fields between the two plates. By measuring the resulting current, the resistance associated with any particular cell can be determined, and from this magnetic orientation of the writable plate (i.e., free layer). Typically if the two plates have the same orientation the cell is considered to hold a value of "0", while if the two plates are of opposite orientation the resistance will be higher and will hold a value of "1".

SUMMARY

According to one or more embodiments, a method of forming a magnetic tunnel junction (MTJ) is provided. The method includes forming a synthetic antiferromagnetic reference layer adjacent to a tunnel barrier layer, where the synthetic antiferromagnetic reference layer includes a first magnetic layer, a second magnetic layer, and a reference spacer layer sandwiched between the first magnetic layer and the second magnetic layer. Also, the method includes forming a magnetic free layer adjacent to the tunnel barrier layer so as to be opposite the synthetic antiferromagnetic reference layer. The synthetic antiferromagnetic reference layer has a thickness of at least one of 3 nanometers (nm), 4 nm, and 3-4 nm.

According to one or more embodiments, a semiconductor device is provided. The semiconductor device includes a synthetic antiferromagnetic reference layer adjacent to a tunnel barrier layer, where the synthetic antiferromagnetic reference layer includes a first magnetic layer, a second magnetic layer, and a reference spacer layer sandwiched between the first magnetic layer and the second magnetic layer. Also, the semiconductor device includes a magnetic free layer adjacent to the tunnel barrier layer so as to be opposite the synthetic antiferromagnetic reference layer. The synthetic antiferromagnetic reference layer has a thickness of at least one of 3 nanometers (nm), 4 nm, and 3-4 nm. A sandwich of the synthetic antiferromagnetic reference layer, the tunnel barrier layer, and the magnetic free layer together form a magnetic tunnel junction (MTJ).

According to one or more embodiments, a method of forming a magnetic tunnel junction (MTJ) is provided. The method includes forming a synthetic antiferromagnetic reference layer adjacent to a tunnel barrier layer, where the synthetic antiferromagnetic reference layer includes a first magnetic layer, a second magnetic layer, and a reference spacer layer sandwiched between the first magnetic layer and the second magnetic layer. Also, the method includes forming a magnetic free layer adjacent to the tunnel barrier layer so as to be opposite the synthetic antiferromagnetic reference layer. The synthetic antiferromagnetic reference layer has a thickness of at least one of 3 nanometers (nm), 4 nm, and 3-4 nm. A combination of the first magnetic layer, the second magnetic layer, and the reference spacer layer does not repeat within the synthetic antiferromagnetic reference layer.

BRIEF DESCRIPTION OF THE DRAWINGS

FIG. 1 is a cross-sectional view of a magnetic tunnel junction (MTJ) according to one or more embodiments.

FIG. 2 is a cross-sectional view of a portion of the MTJ depicting details of the synthetic antiferromagnetic reference layer according to one or more embodiments.

FIG. 5 is a flow chart of a method of forming a magnetic tunnel junction (MTJ) according to one or more embodiments.

DETAILED DESCRIPTION

Figure 3A:
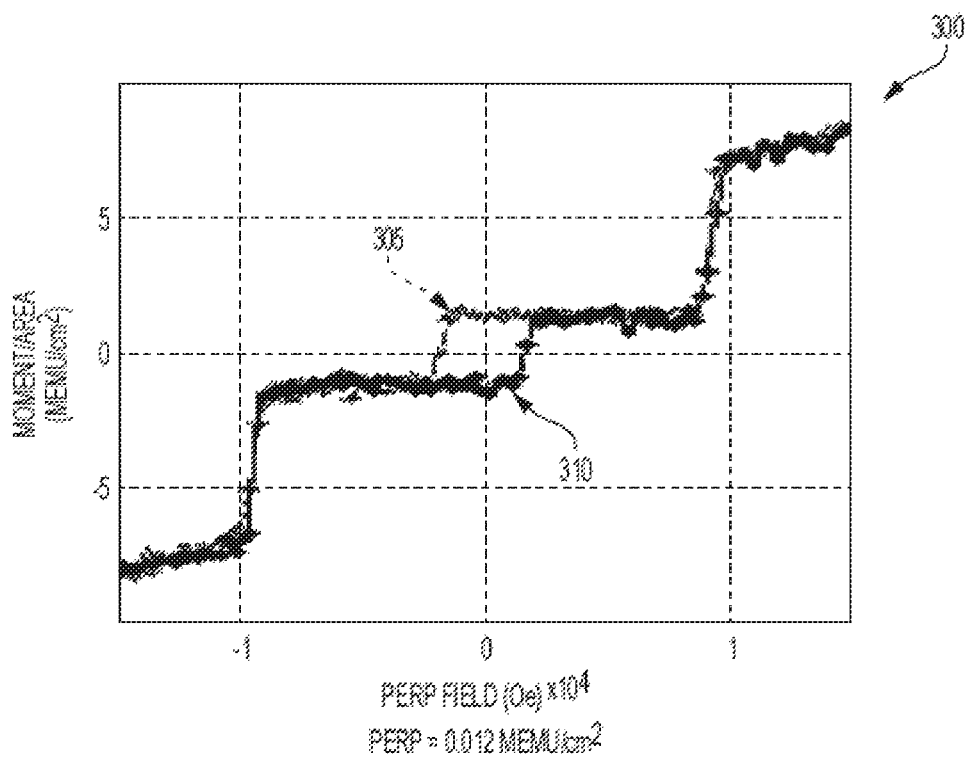
FIG. 3A is a graph depicting perpendicular magnetic anisotropy of the synthetic antiferromagnetic reference layer according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Magnetic random access memory (MRAM) is a non-volatile solid state memory technology compatible with standard semiconductor manufacturing. Information is stored in the magnetic orientation of a free layer film in relation to that of a reference film. Reading the state of the cell or bit is accomplished by measuring the electrical resistance of a magnetic tunnel junction formed by a sandwich of the free layer, a tunneling barrier, and the reference layer (MTJ stack).

Writing the bit can be achieved in several ways, depending on the technology in use. In spin transfer torque MRAM, external fields are not used in the writing process. Instead, electrical currents passing between the reference layer and the free layer films/plates carry not only a charge current but in addition a spin current. This spin current transferred between the two magnetic films (i.e., the reference layer and the free layer) acts to orient the free layer either parallel or antiparallel to the reference layer, depending on the sign of the electrical current.

Spin torque transfer MRAM (STT) uses a 2-terminal device with a pinned layer, tunnel barrier, and free layer in a magnetic tunnel junction stack. Recently, systems with perpendicular magnetic anisotropy (PMA) have become the mainstream of the field, due to the fact that PMA materials offer better switching efficiency and high thermal stability, compared to materials with in-plane magnetic anisotropy. CoFeB based materials with double oxide interfaces have been widely adopted for free layer applications. While for reference layers, various multilayer structures, including Co|Ni, Co|Pt and Co|Ir were commonly used, where "|" represents the separation of one layer from another layer. For x|y, this represents layer "y" on layer "x" in a stack. These multilayers (of the reference layer) usually grow in a FCC structure with (111) texture which does not match with the MgO tunnel barrier for high tunneling magneto-resistance (TMR). In order to overcome this structural mismatch and to achieve high TMR, a bilayer structure which includes one spacer and a CoFeB based interfacial layer is needed. The spacer layer is sandwiched between two CoFeB layers. As a result, a multilayer structure with strong PMA is needed to support the relatively thick CoFeB layer which has in-plane anisotropy. In the state-of-the-art, the strong PMA is achieved by growing thick multilayers as the reference layer, where the reference layer has a typical thickness of around 100-150 angstroms (Å) (10-15 nanometers (nm)).

The thick reference layer (RL) has multiple disadvantages compared to a thin reference layer. First, one issue is the stack roughness, and the stack roughness increases as the stack (forming the reference layer) becomes thicker. Second, it takes a longer time to grow the reference layer stack and also makes the stack less reproducible. Third, a thicker reference layer stack takes a longer time to etch during the device patterning process, which not only increases the cost, but also imposes more damage to the other parts of the magnetic tunnel junction.

One or more embodiments disclose a new synthetic antiferromagnetic (SAF) reference layer with a thickness down to 30-40 Å (3-4 nm) while still exhibiting very strong PMA and good thermal stability.

FIG. 1 is a cross-sectional view of a magnetic tunnel junction (MTJ) 100 according to one or more embodiments. The MTJ 100 is a stack of layers. The MTJ 100 includes a magnetic free layer 105. The magnetic free layer 105 is disposed on top of a tunnel barrier 110. The tunnel barrier 110 is disposed on top of a synthetic antiferromagnetic (SAF) reference layer 130. The synthetic antiferromagnetic reference layer 130 may be referred to as pinned layer and/or include the pinned layer. The synthetic antiferromagnetic reference layer 130 has a magnetic moment or magnetization that is fixed or pinned in a particular direction, which is represented by an arrow pointing down (which could be pointing up in another example). The magnetic free layer 105 has a magnetic moment or magnetization that can be flipped, which is represented by a double arrow.

The synthetic antiferromagnetic reference layer 130 is a combination of layers as discussed in FIG. 2. The synthetic antiferromagnetic reference layer 130 is formed on a seed layer 135. The MTJ 100 may be formed using standard lithography processes.

FIG. 2 is a cross-sectional view of a portion of the MTJ 100 showing the synthetic antiferromagnetic reference layer 130 on the seed layer 135 according to one or more embodiments. Particularly, FIG. 2 illustrates further details of the synthetic antiferromagnetic reference layer 130.

The synthetic antiferromagnetic reference layer 130 includes a first magnetic layer 205 disposed on top of the seed layer 135, a synthetic antiferromagnetic spacer layer 210 disposed on top of the first magnetic layer 205, and a second magnetic layer 215 disposed on top of synthetic antiferromagnetic spacer layer 210.

As noted herein, the new synthetic antiferromagnetic reference layer 130 is configured with a thickness of about 30-40 Å (3-4 nanometers (nm)) while still providing very strong PMA and good thermal stability. An example of strong PMA may be $H_c$>4 kilo-Oersted (kOe) in patterned devices with diameter of approximately 35 nm, where $H_c$ is the coercivity (also called the magnetic coercivity, coercive field, or coercive force). Having good thermal stability means that the synthetic antiferromagnetic reference layer 130 maintains its strong PMA after being annealed at 400° Celsius (C) for >1 hour (hr). In one implementation, the synthetic antiferromagnetic reference layer 130 may have a thickness of only about 3 nm. The example thin structure shown in FIG. 2 can be compared to a state-of-the-art thick synthetic antiferromagnetic reference layer with multiple repeating layers of a first material (such as Co) and a second material (such as Ir).

Figure 3B:
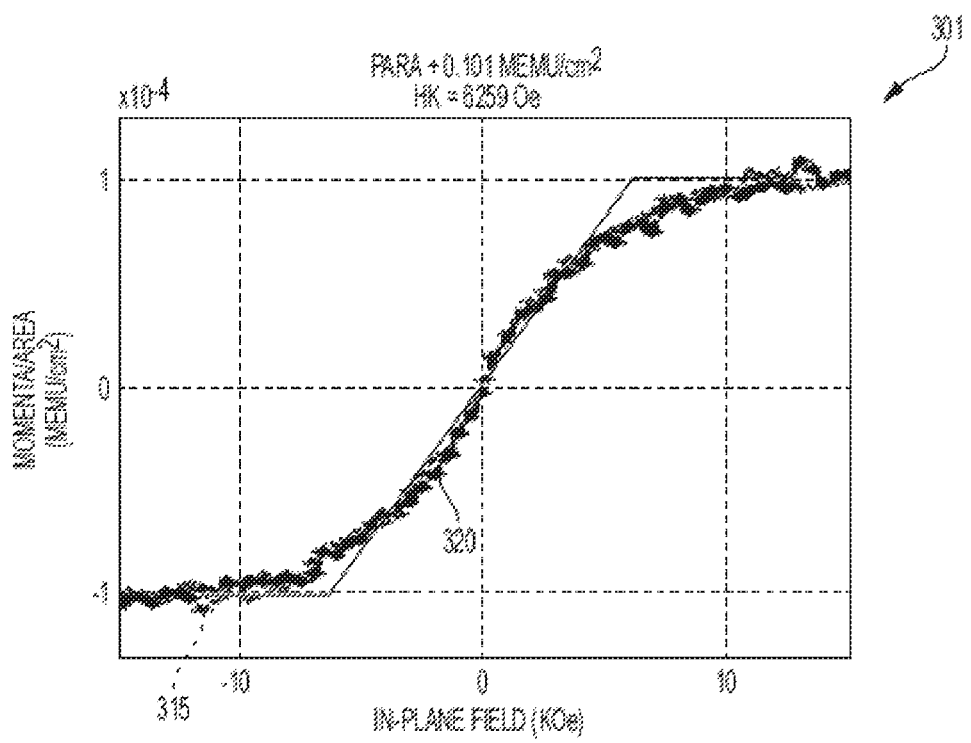
FIG. 3B is a graph depicting perpendicular magnetic anisotropy of the synthetic antiferromagnetic reference layer according to one or more embodiments.

According to one or more embodiments, it has been found that the new ultra-thin synthetic antiferromagnetic reference layer 130 has very strong PMA (as shown in FIG. 3A), with $H_k$>6 kilo-oersted (kOe) after 400° C. anneal (as shown in FIG. 3B), where $H_k$ is the magnetic anisotropy field. Similar TMR was observed in stacks with the ultra-thin synthetic antiferromagnetic reference layer 130 of embodiments, as compared to those with a thick synthetic antiferromagnetic reference layer in the state-of-the-art.

The large and thermally stable PMA may be achieved via seed layer engineering (of the seed layer 135), combined with strong interface anisotropy between Co or Co alloy (in the first magnetic layer 205 and/or second magnetic layer 215) and Ir (of the SAF spacer layer 210). Example materials of seed layer 135 may be, but not limited to, Ir, Ta|Ir, Ni|Cr|Ir, Ta|Ni|Cr|Ir, Ta|Ru|Ir, Ta|Ni|Fe|Ir, Ru|Ir and/or Ni|Fe|Ir. The thickness of the seed layer 135 may vary from about 1-5 nm. In one implementation, the seed layer 135 may be about 1 nm.

The first magnetic layer 205 may be Co, and/or Co alloys including CoNi, CoFe, and CoFeB, and the thickness of the first magnetic layer 205 may range from 0.5-23 nm. In one implementation, the first magnetic layer 205 may have a thickness of 1.0 nm.

As long as it provides strong SAF coupling between the first and second magnetic layers 205 and 215, the synthetic antiferromagnetic spacer layer 210 may include any of the following elements and/or the alloy of any two or more of elements: Ir, Ru, Rh, or/and Os. An example thickness of the synthetic antiferromagnetic spacer layer is 0.3-2 nm. In one implementation, the synthetic antiferromagnetic spacer layer 210 is 0.5 nm.

The second magnetic layer 215 may be a tri-layer structure. The tri-layer structure of the second magnetic layer 215 includes a bottom magnetic layer 250, a middle spacer layer 255 disposed on top of the bottom magnetic layer 250, and a top magnetic layer 260 disposed on top of the middle spacer layer 255. The bottom layer 250 is Co or Co alloys, and the bottom layer 250 has a thickness ranging from 0.2-2 nm. In one implementation, the bottom layer 250 is 0.5 nm thick.

The middle spacer layer 255 is W, Mo and/or Ta, which may be an alloy or multilayers of W, Mo and/or Ta. The middle spacer layer 255 may also be a multilayer structure with repeats of a Co, Fe, Ni, CoFeB containing layer|W, Mo or Ta (or alloys/multilayers of W, Mo and Ta). The middle spacer layer 255 may have a thickness ranging from 0.2-2 nm. In one implementation, the middle spacer layer 255 may be 0.2 nm.

The top layer 260 may be Co, CoFeB, Fe and/or CoFe based. Also, the top layer 260 may be a bilayer structure composed of any two of Co, Fe, and B. The thickness of the top layer 260 may range from ranging from 0.2-2 nm.

The state-of-the-art would not have utilized such a thin synthetic antiferromagnetic reference layer because of the lack of strong PMA in a thin magnetic layer 205 in conventional multilayer reference layers.

FIG. 3A is a graph 300 depicting perpendicular magnetic anisotropy of the synthetic antiferromagnetic reference layer 130 according to one or more embodiments. The x-axis shows the perpendicular field (measured in Oe) and the y-axis shows the moment per area (memu/cm$^2$, where memu is milli-emu).

The graph 300 includes a plot of line 305 and 310 which illustrates the direct write field of a blanket thin SAF reference layer stack (that is approximately 35 Å thick) after 400° C. annealing.

FIG. 3B is a graph 301 depicting perpendicular magnetic anisotropy of the blanket synthetic antiferromagnetic reference layer 130 according to one or more embodiments after 400 C annealing. The x-axis shows the in-plane field (measured in kOe) and the y-axis shows the moment per area (memu/cm$^2$, where memu is milli-emu). The graph 301 shows that the in-plane saturation field is about 10 kOe, which is an indication of strong perpendicular magnetic anisotropy.

Figure 4:
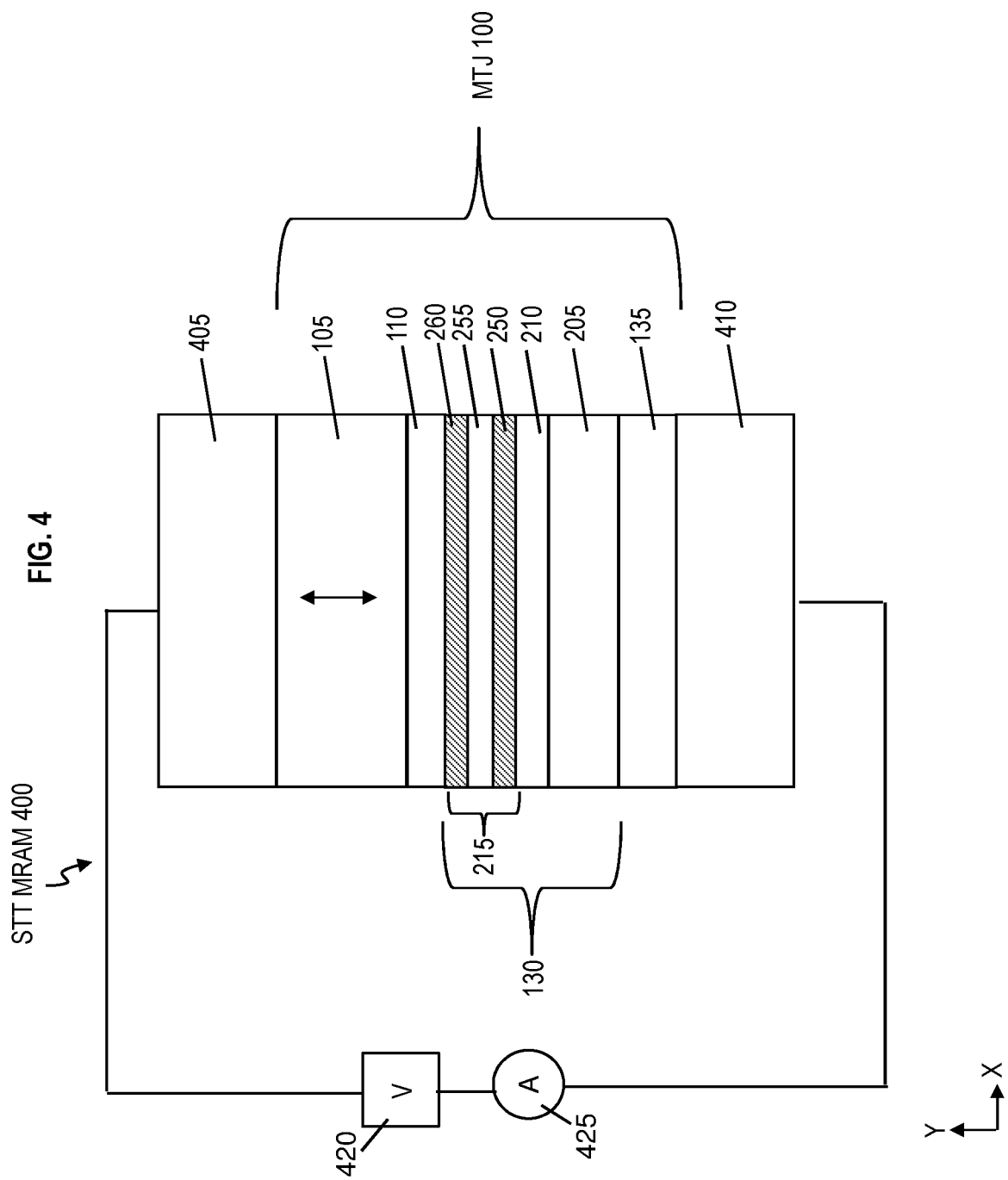
FIG. 4 is a cross-sectional view of a spin torque transfer (STT) magnetic random access memory device (MRAM) according to one or more embodiments.

FIG. 4 is a cross-sectional view of a spin torque transfer magnetic random access memory device 400 according to one or more embodiments. A contact 405 may be formed on top of the MTJ 100. The contact 405 may be a write line.

A contact 410 may be formed on the bottom of the MTJ 100. The contact 410 may be a bit line or a selector line. The contacts 405 and 410 may include conductive materials.

The contacts 405 and 410 connect the MTJ 100 to a voltage source 420 and ammeter 425. The voltage source 420 (or current source) may be utilized to pass write electrical current down through contact 405 into the MTJ 100. The electrical current passing through the MTJ 100 is spin current having an angular momentum to switch the magnetic moment of the magnetic free layer 105 according to the direction of the spin current.

The voltage source 420 may be utilized to pass write electrical current up through contact 410 into the MTJ 100. The electrical current passing up through the MTJ 100 is spin current having an angular momentum to switch the magnetic moment of the magnetic free layer 105 in an opposite direction according to the spin current.

To read the MTJ 100, the voltage source 420 may be utilized to pass a read electrical current (which has a lower magnitude than the write current) through the MTJ 100 to determine the resistance of the free layer 105 relative to the reference layer 130. In one implementation, the resistance of the MTJ 100 is high when the magnetic moments of the free layer 105 and reference layer 130 are antiparallel (i.e., pointing in opposite directions). The resistance of the MTJ 100 is low when the magnetic moments of the free layer 105 and reference layer 130 are parallel (i.e., pointing in the same direction).

FIG. 5 is a flow chart of a method 500 of forming a magnetic tunnel junction (MTJ) 100 according to one or more embodiments. Reference can be made to FIGS. 1-4.

At block 505, a synthetic antiferromagnetic reference layer 130 is formed adjacent to a tunnel barrier layer 110, where the synthetic antiferromagnetic reference layer 130 includes a first magnetic layer 205, a second magnetic layer 215, and a reference spacer layer 210 sandwiched between the first magnetic layer and the second magnetic layer.

At block 510, a magnetic free layer 105 is formed adjacent to the tunnel barrier layer 110 so as to be opposite the synthetic antiferromagnetic reference layer 130.

At block 515, the synthetic antiferromagnetic reference layer 130 has a thickness of at least one of 3 nanometers (nm), 4 nm, and/or 3-4 nm.

The first magnetic layer 205 is configured to have a thickness as small as 0.5 nm. The first magnetic layer includes Co.

The second magnetic layer 215 includes a bottom magnetic layer 250, a middle spacer layer 255 disposed on top of the bottom magnetic layer, and a top magnetic layer 260 disposed on top of the middle spacer layer.

The bottom magnetic layer 250 includes Co. The bottom magnetic layer has a thickness ranging from 0.2-2 nm.

The middle spacer layer 255 includes at least one of W, Mo, and/or Ta. The middle spacer layer can also be a multilayer structure (with repeats of a Co, Fe, Ni, CoFeB containing layer|W, Mo or Ta (or alloys/multilayers of W, Mo and Ta)). The middle spacer layer has a thickness ranging from 0.2-2 nm.

The top magnetic layer 260 includes at least one of Co, CoFeB, Fe, and CoFe and/or a bilayer structure of any two of Co, Fe, and B. The top magnetic layer has a thickness ranging from 0.2-2 nm.

The reference spacer layer 210 includes at least one of Ir, Ru, Rh, and Os and has a thickness ranging from 0.3-2 nm. The synthetic antiferromagnetic reference layer 130 is formed on top of a seed layer 135. The seed layer 135 comprises at least one of Ir, Ta, NiCr, Pd, Pt, and Ru, and the seed layer has a thickness ranging from 1-5 nm.

A combination of the first magnetic layer 205, the second magnetic layer 215, and the reference spacer layer 210 does not repeat within the synthetic antiferromagnetic reference layer 130.

Technical effects and benefits include improved semiconductor devices, such as, e.g., integrated circuits, on a wafer. The improved integrated circuit improves a computer memory. The technical effects further include forming an MTJ stack with a new magnetic reference layer that is thinner, thus requiring less etching which has a smaller effect on other devices.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a synthetic antiferromagnetic reference layer in direct contact with both a tunnel barrier layer and a seed layer, the synthetic antiferromagnetic reference layer including a first magnetic layer, a second magnetic layer, and a reference spacer layer sandwiched between the first magnetic layer and the second magnetic layer, wherein the second magnetic layer includes a bottom magnetic layer, a middle spacer layer, and a top magnetic layer, the middle spacer layer of the synthetic antiferromagnetic reference layer in direct contact with both the tunnel barrier layer and the seed layer being in direct contact with both the bottom and top magnetic layers and being a multilayer structure comprising Ta, W, and Mo, the first magnetic layer of the synthetic antiferromagnetic reference layer having the multilayer structure comprising Ta, W, and Mo being in direct contact with both the reference spacer layer and the seed layer; and
a magnetic free layer adjacent to the tunnel barrier layer so as to be opposite the synthetic antiferromagnetic reference layer, the middle spacer layer with the multilayer structure comprising Ta, W, and Mo and the free magnetic layer sandwiching the reference spacer layer in between, the middle spacer layer with the multilayer structure comprising Ta, W, and Mo and the seed layer sandwiching the first magnetic layer in between;
wherein the synthetic antiferromagnetic reference layer has a thickness selected from the group consisting of about 3 nanometers (nm), about 4 nm, and about 3 to 4 nm.

2. The semiconductor device of claim 1, wherein a sandwich of the synthetic antiferromagnetic reference layer, the tunnel barrier layer, and the magnetic free layer together form a magnetic tunnel junction (MTJ).

3. The semiconductor device of claim 1, wherein the first magnetic layer comprises a thickness as small as about 0.5 nm.

4. The semiconductor device of claim 1, wherein the first magnetic layer includes Co.

5. The semiconductor device of claim 1, wherein the synthetic antiferromagnetic reference layer consists of the first magnetic layer, the second magnetic layer, and the reference spacer layer.

6. The semiconductor device of claim 1, wherein the bottom magnetic layer includes Co.

7. The semiconductor device of claim 1, wherein the bottom magnetic layer comprises a thickness ranging from about 0.2 to 2 nm.

8. The semiconductor device of claim 1, wherein the middle spacer layer further comprises CoFeB.

9. The semiconductor device of claim 1, wherein the middle spacer layer is disposed on top of the bottom magnetic layer, and the top magnetic layer is disposed on top of the middle spacer layer.

10. The semiconductor device of claim 1, wherein:
the top magnetic layer is selected from the group consisting of Co, CoFeB, Fe, and CoFe.

11. The semiconductor device of claim 1, wherein:
the top magnetic layer is a bilayer structure selected from the group consisting of of any two of Co, Fe, and B.

12. The semiconductor device of claim 1, wherein:
the top magnetic layer comprises a thickness ranging from about 0.2 to 2 nm.

13. The semiconductor device of claim 1, wherein the reference spacer layer is selected from the group consisting of Ir, Ru, Rh, and Os.

14. The semiconductor device of claim 1, wherein the reference spacer layer comprises a thickness ranging from about 0.3 to 2 nm.

15. The semiconductor device of claim 1, wherein the synthetic antiferromagnetic reference layer is formed on top of and in direct contact with a seed layer.

16. The semiconductor device of claim 15, wherein the seed layer is selected from the group consisting of Ir, Ta, NiCr, Pd, Pt, and Ru.

17. The semiconductor device of claim 15, wherein the seed layer comprises a thickness ranging from about 1 to 5 nm.

18. The semiconductor device of claim 1, wherein:
the middle spacer layer is an alloy of materials.

19. The semiconductor device of claim 18, wherein the middle spacer layer further comprises CoFeB.

20. The semiconductor device of claim 1, wherein:
the middle spacer layer is about 2 nm.

* * * * *